(12) United States Patent
Masumoto

(10) Patent No.: US 11,538,727 B2
(45) Date of Patent: Dec. 27, 2022

(54) SEMICONDUCTOR MODULE

(71) Applicant: Mitsubishi Electric Corporation, Tokyo (JP)

(72) Inventor: Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 165 days.

(21) Appl. No.: 16/934,413

(22) Filed: Jul. 21, 2020

(65) Prior Publication Data

US 2021/0210401 A1 Jul. 8, 2021

(30) Foreign Application Priority Data

Jan. 7, 2020 (JP) .............................. JP2020-000963

(51) Int. Cl.
*H01L 23/31* (2006.01)
*H01L 23/13* (2006.01)
*H01L 23/498* (2006.01)
*H01L 23/00* (2006.01)
*H01L 21/56* (2006.01)
(Continued)

(52) U.S. Cl.
CPC .......... *H01L 23/3142* (2013.01); *H01L 21/54* (2013.01); *H01L 21/56* (2013.01); *H01L 23/13* (2013.01); *H01L 23/498* (2013.01); *H01L 24/48* (2013.01); *H01L 23/04* (2013.01); *H01L 23/041* (2013.01); *H01L 23/043* (2013.01); *H01L 23/053* (2013.01); *H01L 23/10* (2013.01); *H01L 23/367* (2013.01); *H01L 2224/48091* (2013.01); *H01L 2224/48225* (2013.01);
(Continued)

(58) Field of Classification Search
CPC ..... H01L 23/04; H01L 23/10; H01L 23/3142; H01L 23/041; H01L 23/043; H01L 23/053; H01L 23/367
See application file for complete search history.

(56) References Cited

U.S. PATENT DOCUMENTS 5,606,200 A    2/1997  Haraguchi et al.
5,909,056 A *  6/1999  Mertol ................ H01L 23/3675
                                                  257/796
(Continued)

FOREIGN PATENT DOCUMENTS

DE    694 07 064 T2    6/1998
JP    S60-216571 A    10/1985
(Continued)

OTHER PUBLICATIONS

An Office Action mailed by the German Patent Office dated Jul. 4, 2022, which corresponds to German Patent Application No. 10 2020 122 788.4 and is related to U.S. Appl. No. 16/934,413; with English language translation.

*Primary Examiner* — David A Zarneke
(74) *Attorney, Agent, or Firm* — Studebaker & Brackett PC

(57) ABSTRACT

A semiconductor module includes: a case; a semiconductor chip provided inside the case; a seal material injected to inside of the case and sealing the semiconductor chip; and a lid provided inside the case and contacting an upper surface of the seal material, wherein a tapered portion is provided at an end portion of the lid on an upper surface side, a gap is provided between a side surface of the end portion of the lid and an inner side surface of the case, and the seal material crawls up to the tapered portion through the gap.

10 Claims, 12 Drawing Sheets

(51) Int. Cl.
  *H01L 21/54* (2006.01)
  *H01L 23/04* (2006.01)
  *H01L 23/043* (2006.01)
  *H01L 23/10* (2006.01)
  *H01L 23/367* (2006.01)
  *H01L 23/053* (2006.01)

(52) U.S. Cl.
  CPC ......... *H01L 2924/1033* (2013.01); *H01L 2924/10254* (2013.01); *H01L 2924/10272* (2013.01)

(56) References Cited

U.S. PATENT DOCUMENTS

| | | | | |
|---|---|---|---|---|
| 5,963,795 | A * | 10/1999 | Schneider | H01L 23/3672 438/118 |
| 6,236,568 | B1 * | 5/2001 | Lai | H01L 24/33 257/796 |
| 6,979,594 | B1 * | 12/2005 | Fan | H01L 23/4334 257/E23.092 |
| 7,250,576 | B2 * | 7/2007 | Colgan | H01L 23/04 257/E23.09 |
| 7,315,080 | B1 * | 1/2008 | Fan | H01L 23/055 257/E23.09 |
| 7,508,083 | B2 * | 3/2009 | Hagen | H01L 29/0657 438/126 |
| 7,527,090 | B2 * | 5/2009 | Dani | H01L 23/367 165/185 |
| 7,989,942 | B2 * | 8/2011 | Toong | H01L 24/73 257/E23.085 |
| 9,905,490 | B2 * | 2/2018 | Denta | H01L 23/3735 |
| 10,269,667 | B2 * | 4/2019 | Van Buggenhout | H01L 23/3142 |
| 2008/0042302 | A1 * | 2/2008 | Crispell | H01L 23/3121 257/E23.125 |
| 2014/0167243 | A1 * | 6/2014 | Shen | H01L 23/10 257/692 |

FOREIGN PATENT DOCUMENTS

| JP | H05-121881 A | 5/1993 |
|---|---|---|
| JP | 2008103514 A | 5/2008 |

* cited by examiner

SEMICONDUCTOR MODULE

BACKGROUND OF THE INVENTION

Field

The present disclosure relates to a semiconductor module.

Background

A semiconductor module is utilized in every scene such as electric power generation, electric power transmission, and efficient utilization or regeneration of energy. In these days, demand for moisture resistance of a semiconductor module is increased. To prevent formation of a route of moisture entry to inside of a module, it is necessary to suppress generation of air bubbles inside a seal material. To achieve this, a semiconductor module in which an inlet for injecting a seal material and an outlet are provided at a lid has been proposed (see, for example, JP 2008-103514 A). Even if air bubbles are formed inside the seal material upon injection, the air bubbles are discharged from the outlet.

SUMMARY

However, because it is necessary to provide both the inlet and the outlet at the lid, an area of the seal material, exposed to the atmosphere increases, which causes a problem that moisture resistance is impaired.

The present disclosure has been made to solve the problem as described above, and is directed to providing a semiconductor module which is capable of improving moisture resistance.

A semiconductor module according to the present disclosure includes a case, a semiconductor chip provided inside the case, a seal material which is injected to inside of the case to seal the semiconductor chip, and a lid provided inside the case so as to contact an upper surface of the seal material, a tapered portion is provided at an end portion of the lid on an upper surface side, a gap is provided between a side surface of the end portion of the lid and an inner side surface of the case, and the seal material crawls up to the tapered portion through the gap.

In the present disclosure, the tapered portion is provided at the end portion of the lid on the upper surface side, the gap is provided between the side surface of the end portion of the lid and the inner side surface of the case, and the seal material crawls up to the tapered portion through the gap. By this means, because it is possible to easily confirm that the inside of the case is filled with the seal material so that air bubbles are not included, it is possible to prevent entry of moisture from air bubbles. Further, because it is not necessary to inject a resin, an area of the gap can be reduced. Therefore, because it is possible to lower moisture permeability by reducing an area of a route of moisture entry, an amount of moisture entry to inside of the semiconductor module is reduced, so that it is possible to improve moisture resistance.

Other and further objects, features and advantages of the invention will appear more fully from the following description.

DESCRIPTION OF EMBODIMENTS

A semiconductor module according to the embodiments of the present disclosure will be described with reference to the drawings. The same components will be denoted by the same symbols, and the repeated description thereof may be omitted.

First Embodiment

Figure 1:
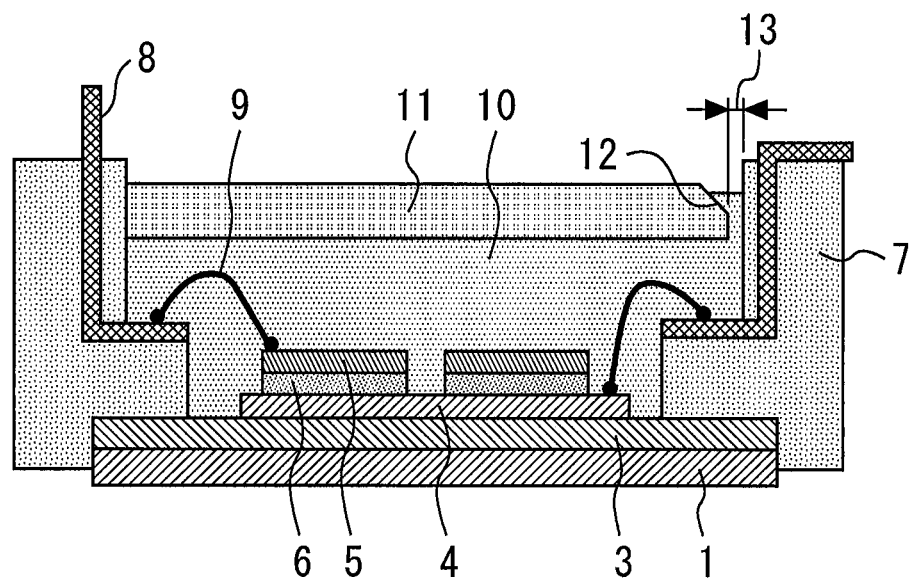
FIG. 1 is a cross-sectional view illustrating a semiconductor module according to a first embodiment.
Figure 2:
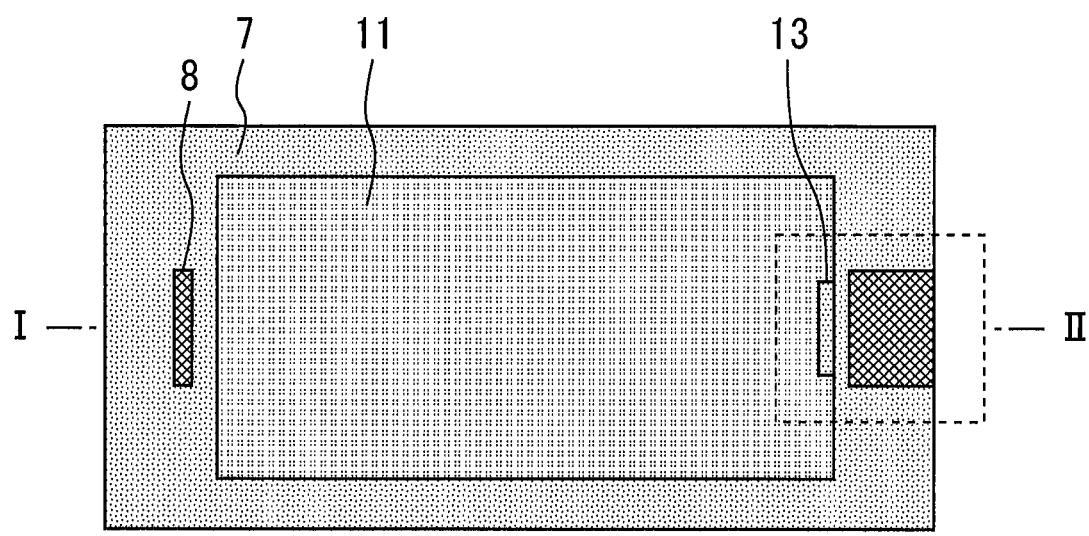
FIG. 2 is a top view illustrating the semiconductor module according to the first embodiment.
Figure 3:
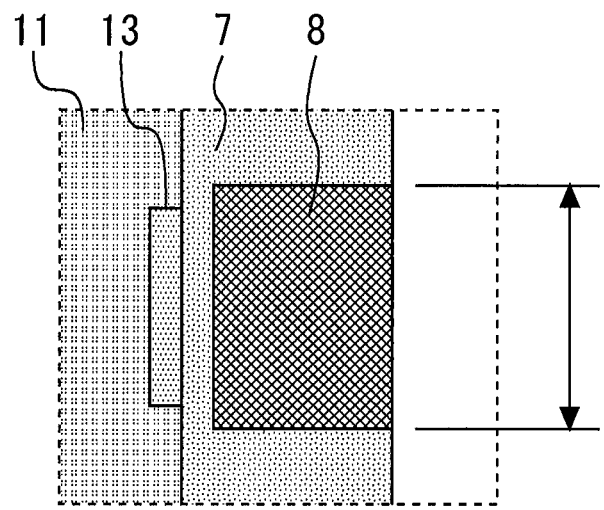
FIG. 3 is an enlarged top view of a portion enclosed with a dashed line in FIG. 2.

FIG. 1 is a cross-sectional view illustrating a semiconductor module according to a first embodiment. FIG. 2 is a top view illustrating the semiconductor module according to the first embodiment. FIG. 1 is a cross-sectional view along I-II in FIG. 2. FIG. 3 is an enlarged top view of a portion enclosed with a dashed line in FIG. 2.

A resin or ceramic insulating layer 3 is formed on a base plate 1. A circuit pattern 4 is formed on the insulating layer 3. A semiconductor chip 5 is mounted on the circuit pattern 4 through solder 6. The semiconductor chip 5 is an IGBT chip or a diode chip. A case 7 is bonded to peripheral portions of the base plate 1 and the insulating layer 3 so as to enclose the circuit pattern 4 and the semiconductor chip 5. A terminal electrode 8 of the case 7 is connected to a top electrode of the semiconductor chip 5 through a wire 9.

A seal material 10 such as silicone gel is injected to inside of the case 7 to seal the semiconductor chip 5 and the wire 9. A lid 11 is provided inside the case 7 so as to contact an upper surface of the seal material 10. A tapered portion 12 is provided at an end portion of the lid 11 on an upper surface side. A gap 13 is provided between a side surface of the end portion of the lid 11 and an inner side surface of the case 7. The seal material 10 crawls up to the tapered portion 12 through the gap 13.

Figure 4:
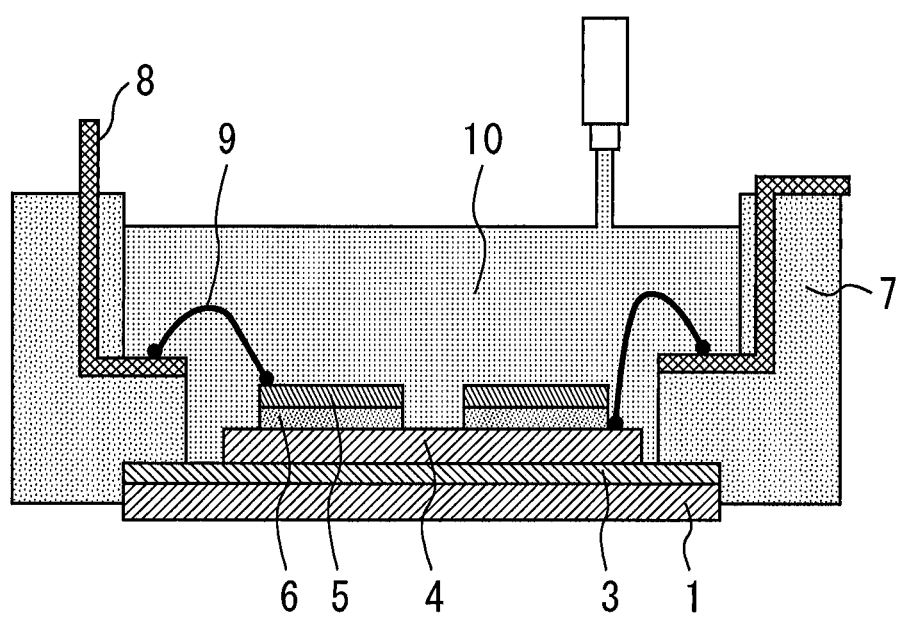
FIG. 4 is a cross-sectional view illustrating manufacturing process of the semiconductor module according to the first embodiment.
Figure 5:
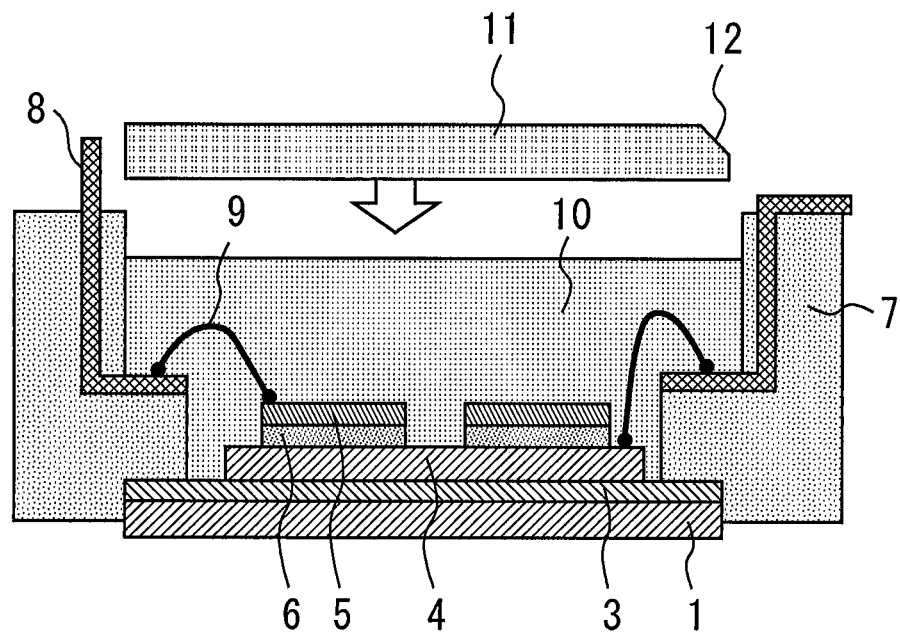
FIG. 5 is a cross-sectional view illustrating manufacturing process of the semiconductor module according to the first embodiment.
Figure 6:
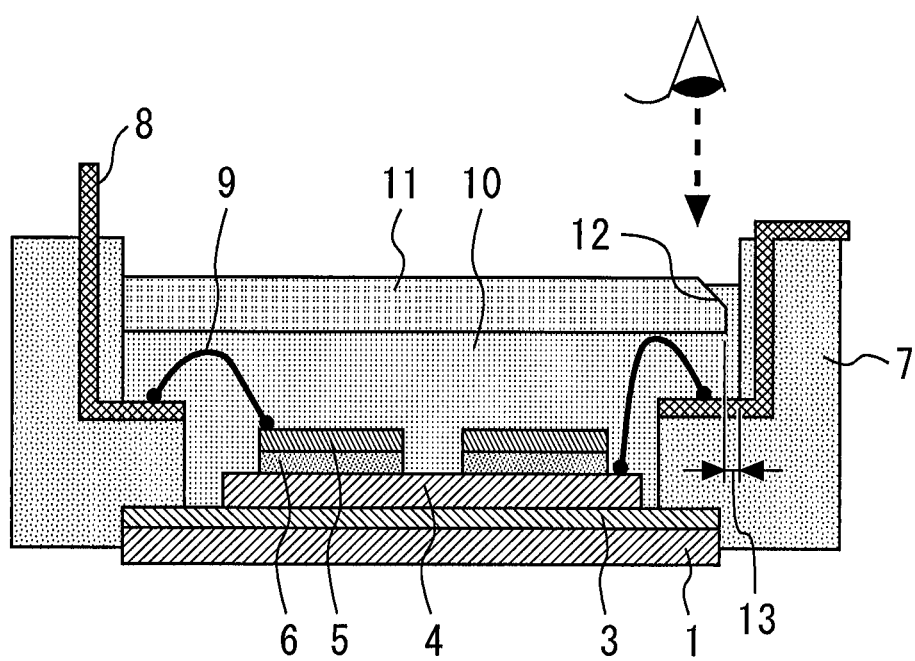
FIG. 6 is a cross-sectional view illustrating manufacturing process of the semiconductor module according to the first embodiment.

FIG. 4 to FIG. 6 are cross-sectional views illustrating manufacturing process of the semiconductor module according to the first embodiment. First, as illustrated in FIG. 4, the seal material 10 is injected to inside of the case 7 to seal the semiconductor chip 5 and the wire 9. Then, as illustrated in FIG. 5, the lid 11 is put on the upper surface of the seal material 10. At this time, there is a case where air bubbles may be formed at the interface of the lid 11 and the seal material 10. If air bubbles exist inside the seal material 10, they become a route of moisture entry. However, even if air bubbles are formed, by the lid 11 being pushed on the seal material 10 side, the air bubbles are discharged through the gap 13 between the case 7 and the lid 11. Therefore, it is possible to secure a state where air bubbles are not included in the cured seal material 10.

Further, when the lid 11 is pushed on the seal material 10 side, as illustrated in FIG. 6, the seal material 10 crawls up to the tapered portion 12 of the lid 11 through the gap 13. By observing this aspect, it is possible to easily confirm that the inside of the case 7 is filled with the seal material 10 so that air bubbles are not included. Therefore, process for confirming performance of the cured seal material 10 with an X-ray, or the like, becomes unnecessary. Further, because air bubbles are not included between the seal material 10 and the lid 11, it is possible to prevent moisture entry from air bubbles.

Moisture enters inside of the case 7 from the upper surface of the seal material 10 which has contact with the atmosphere. Meanwhile, in the present embodiment, the gap 13 between the case 7 and the lid 11 becomes a route of moisture entry. In related art, because it is necessary to make a diameter of an inlet provided at a lid for injecting a resin equal to or greater than 5 mm, it is impossible to reduce an area of a route of moisture entry from the inlet. In contrast, because it is not necessary to inject a resin through the gap 13 in the present embodiment, it is possible to reduce an area. Therefore, because it is possible to lower moisture permeability by reducing an area of the route of moisture entry, an amount of moisture entry to inside of the semiconductor module is reduced, so that it is possible to improve moisture resistance.

For example, in a case where the seal material 10 with low viscosity is used, an opening by the gap 13 may be a rectangle of approximately 2 mm×1 mm. Here, 2 mm is a width of internal space of the case 7 or the lid 11, and 1 mm is a width of the gap 13. However, a lower limit value of the width of the gap 13 required for allowing the seal material 10 to crawl up to the tapered portion 12 through the gap 13 is not limited to 1 mm, and depends on various elements such as viscosity of the seal material 10 and pressing force to be applied to the lid 11. In a case where a resin with extremely low viscosity is used as the seal material 10, even if the width of the gap 13 is equal to or less than 0.5 mm, the seal material 10 can crawl up to the tapered portion 12 through the gap 13. Meanwhile, to suppress moisture entry, the width of the gap 13 is preferably set at equal to or less than 2 mm. However, an upper limit value of the width of the gap 13 depends on various elements such as a size of the semiconductor module, a type of the lid 11 to be used, a member such as the semiconductor chip 5 for which it is desired to suppress moisture absorption and a thickness of the seal material 10.

Second Embodiment

Figure 7:
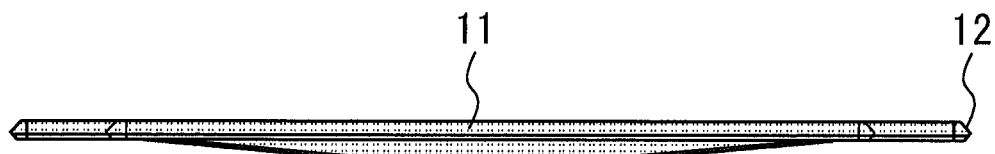
FIG. 7 is a cross-sectional view illustrating a lid of a semiconductor module according to a second embodiment.
Figure 8:
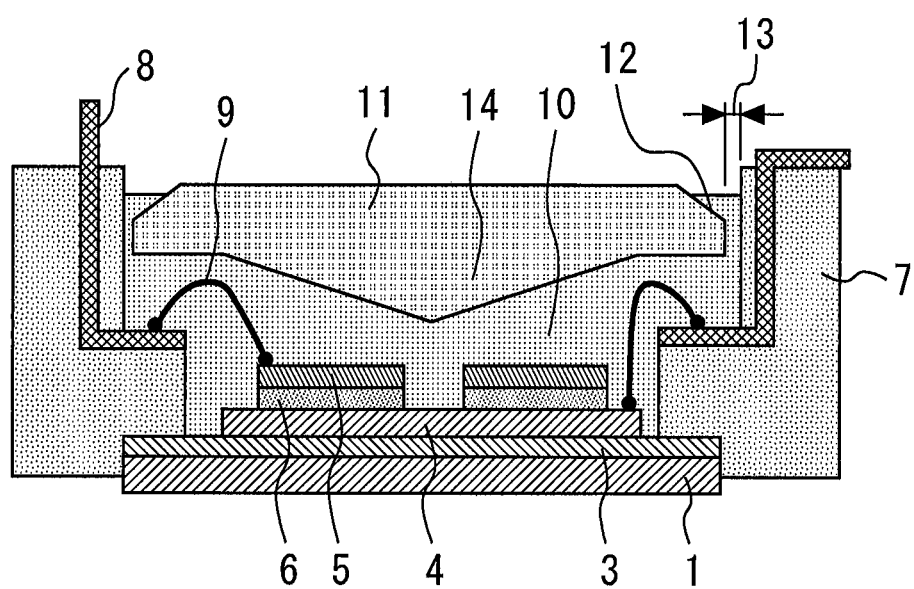
FIG. 8 is a cross-sectional view illustrating the semiconductor module according to the second embodiment.

FIG. 7 is a cross-sectional view illustrating a lid of a semiconductor module according to a second embodiment. FIG. 8 is a cross-sectional view illustrating the semiconductor module according to the second embodiment. In the present embodiment, a conical protruding portion 14 whose central portion protrudes toward the seal material 10 is provided at a lower surface of the lid 11.

Figure 9:
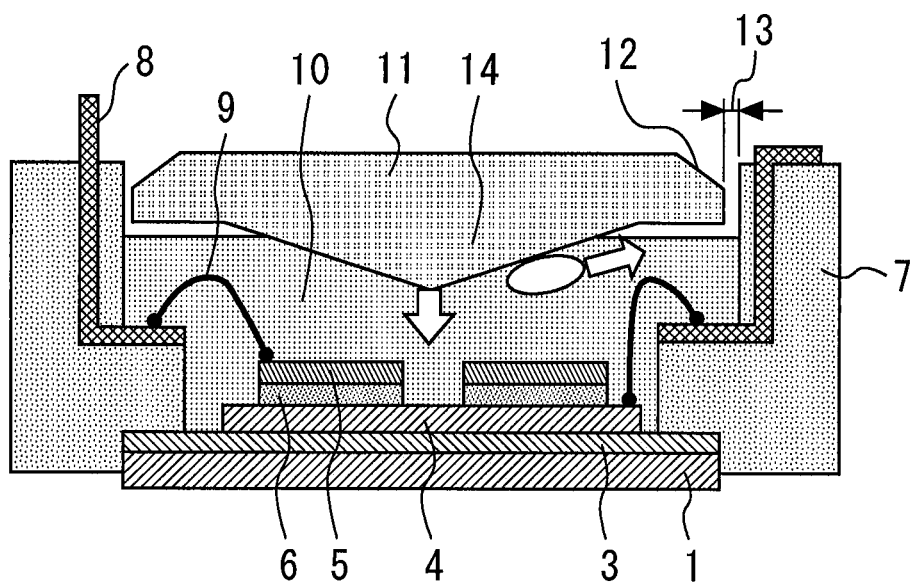
FIG. 9 is a cross-sectional view illustrating manufacturing process of the semiconductor module according to the second embodiment.

FIG. 9 is a cross-sectional view illustrating manufacturing process of the semiconductor module according to the second embodiment. Even if air bubbles are formed at the interface between the seal material 10 and the lid 11 when the lid 11 is put on the upper surface of the seal material 10, the air bubbles are pushed out along the tapered portion of the protruding portion 14 and discharged through the gap 13 between the case 7 and the lid 11. By this means, capability of discharging air bubbles becomes higher than that in the first embodiment. Further, it is possible to reduce an area of the gap 13. As a result, an amount of moisture entry to inside of the semiconductor module is reduced, so that it is possible to further improve moisture resistance.

Third Embodiment

Figure 10:
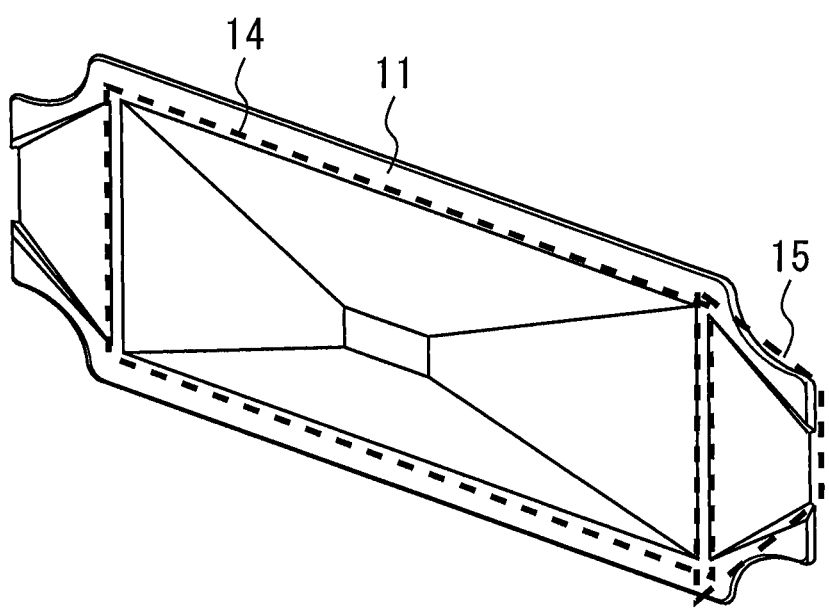
FIG. 10 is a perspective view illustrating a lower surface side of a lid of a semiconductor module according to a third embodiment.
Figure 11:
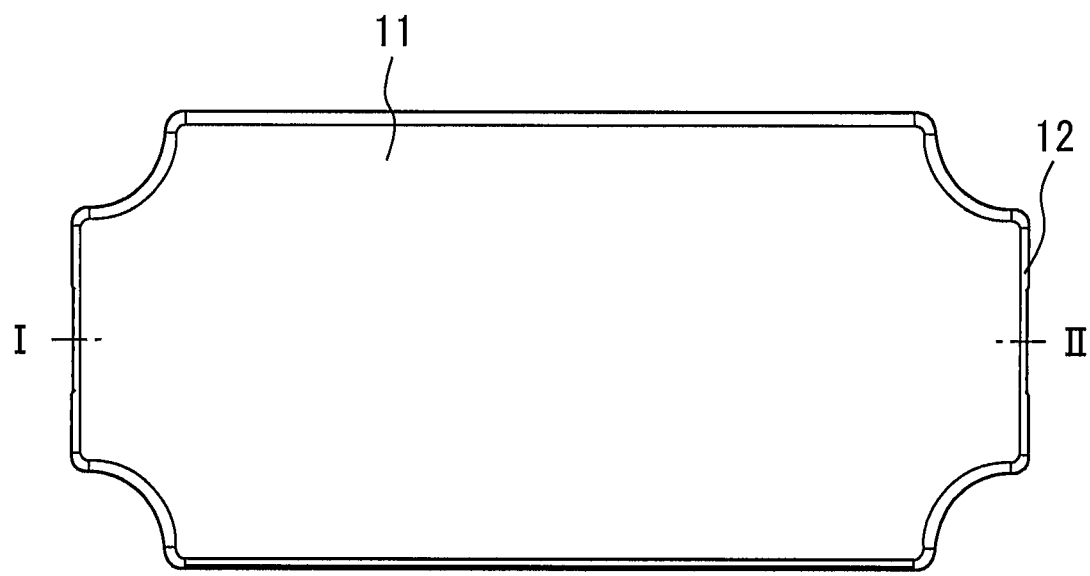
FIG. 11 is a top view illustrating the lid of the semiconductor module according to the third embodiment.
Figure 12:
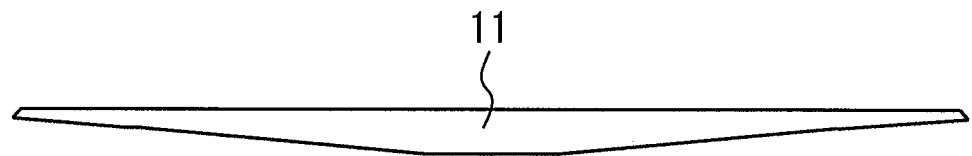
FIG. 12 is a cross-sectional view along I-II in FIG. 11.
Figure 13:
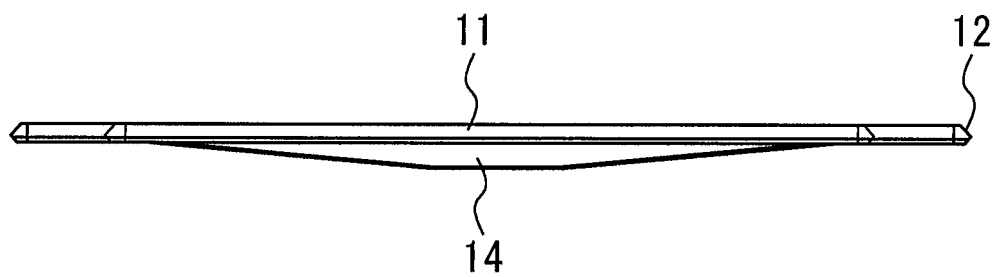
FIG. 13 is a side view illustrating the lid of the semiconductor module according to the third embodiment.
Figure 14:
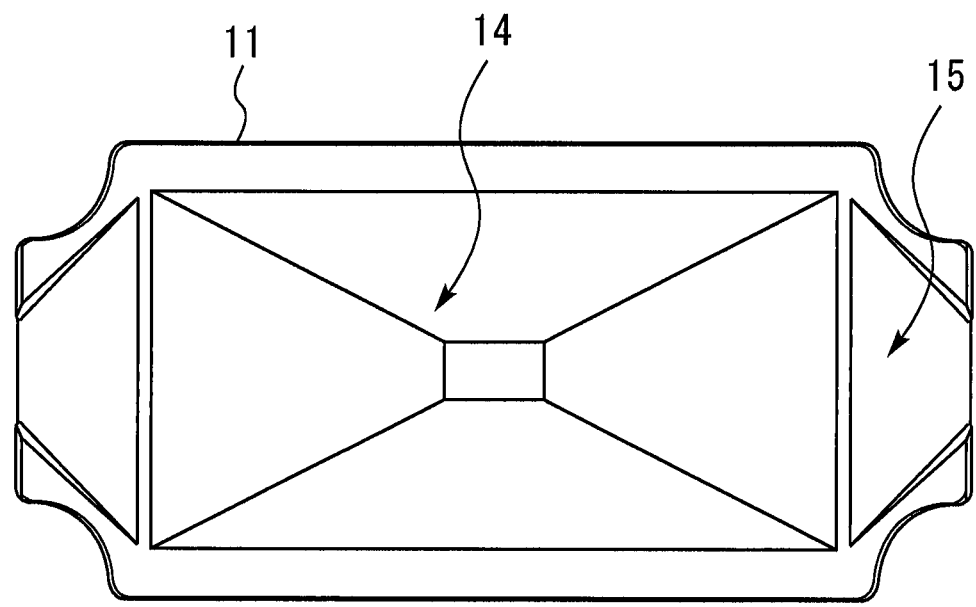
FIG. 14 is a bottom view illustrating the lid of the semiconductor module according to the third embodiment.

FIG. 10 is a perspective view illustrating a lower surface side of a lid of a semiconductor module according to a third embodiment. FIG. 11 is a top view illustrating the lid of the semiconductor module according to the third embodiment. FIG. 12 is a cross-sectional view along I-II in FIG. 11. FIG. 13 is a side view illustrating the lid of the semiconductor module according to the third embodiment. FIG. 14 is a bottom view illustrating the lid of the semiconductor module according to the third embodiment.

A flow channel 15 through which the seal material 10 flows toward the end portion of the lid 11 is provided on a lower surface of the lid 11. Walls for restricting a direction in which the seal material 10 flows are provided at both sides of the flow channel 15. The gap 13 between the case 7 and the lid 11 is formed at a tip of the flow channel 15. Here, the seal material 10 flows toward the whole circumference of the lid 11 along the tapered portion of the protruding portion 14, while a flowing direction is not limited. In contrast, the seal material 10 flows toward the gap 13 along the flow channel 15.

By providing the flow channel 15 as described above, capability of discharging air bubbles becomes further higher. Further, it is possible to farther reduce an area of the gap 13. As a result, an amount of moisture entry to inside of the semiconductor module is reduced, so that it is possible to further improve moisture resistance.

Fourth Embodiment

Figure 15:
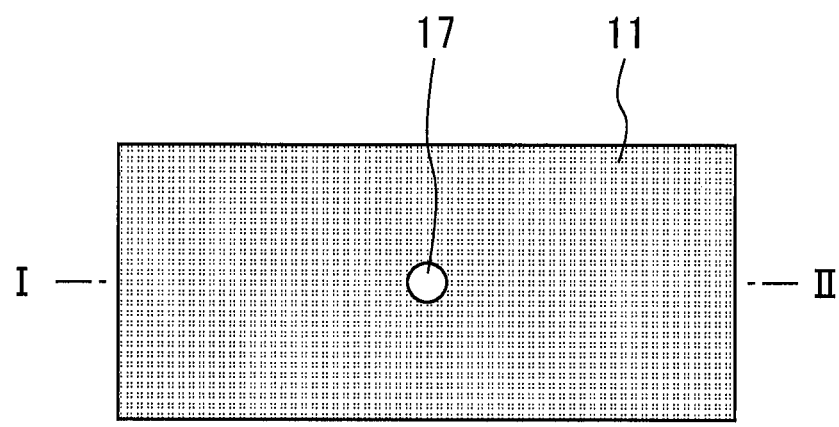
FIG. 15 is a top view illustrating a lid of a semiconductor module according to a fourth embodiment.
Figure 16:
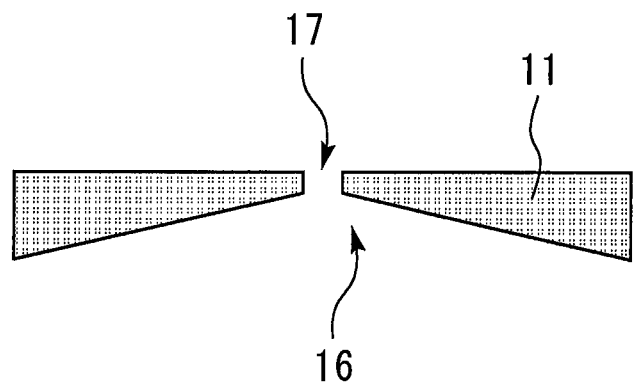
FIG. 16 is a cross-sectional view along I-II in FIG. 15.
Figure 17:
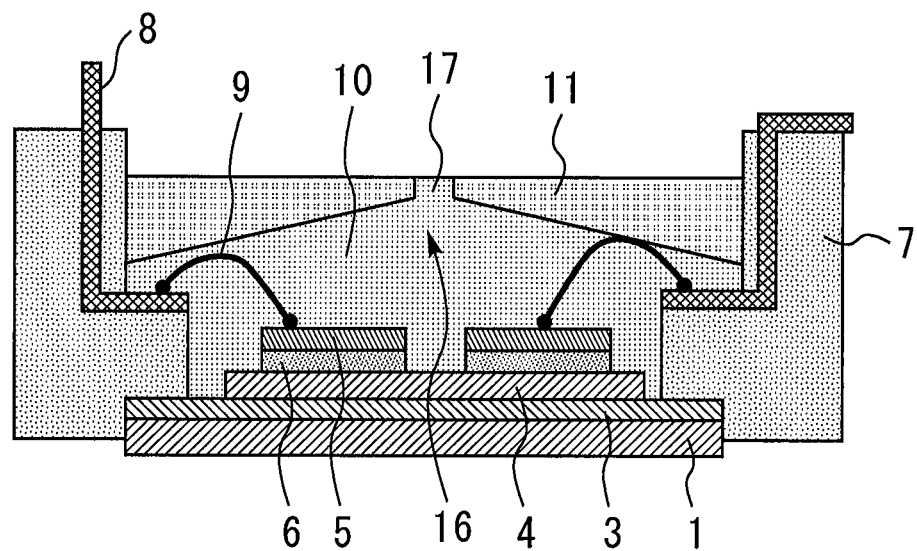
FIG. 17 is a cross-sectional view illustrating the semiconductor module according to the fourth embodiment.

FIG. 15 is a top view illustrating a lid of a semiconductor module according to a fourth embodiment. FIG. 16 is a cross-sectional view along I-II in FIG. 15. FIG. 17 is a cross-sectional view illustrating the semiconductor module according to the fourth embodiment. A conical concave portion 16 which is concave toward the center from the circumference is provided on a lower surface of the lid 11. A hole 17 which penetrates through the lid 11 in a thickness direction is provided at an apex of the concave portion 16.

Even if air bubbles are formed at the interface between the seal material 10 and the lid 11 when the lid 11 is put on the upper surface of the seal material 10, the air bubbles are pushed out along the tapered portion of the conical concave portion 16 and are discharged from the hole 17. In a case where the seal material 10 with low viscosity is used, air bubbles can be sufficiently discharged through the hole 17 having a diameter of approximately 2 mm. However, a lower limit value of the diameter of the hole 17 through which air bubbles can be discharged depends on various elements. Meanwhile, to suppress moisture entry, the diameter of the hole 17 is preferably set at equal to or less than 5 mm. However, an upper limit value of the diameter of the hole depends on various elements.

Because the diameter of the hole 17 can be made smaller as described above, it is possible to reduce an area of a route of moisture entry, so that moisture permeability of a portion where an area is reduced, is lowered. Therefore, an amount of moisture entry to inside of the semiconductor module is reduced, so that it is possible to improve moisture resistance. Further, because it is not necessary to provide the gap 13 between the case 7 and the lid 11, flexibility in the design is increased.

Fifth Embodiment

Figure 18:
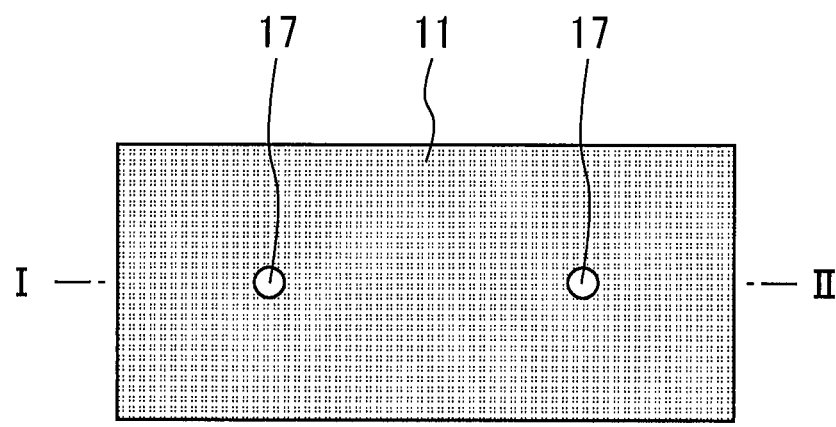
FIG. 18 is a top view illustrating a lid of a semiconductor module according to a fifth embodiment.
Figure 19:
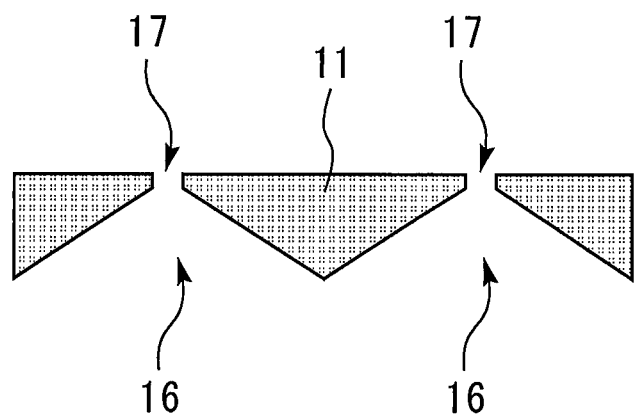
FIG. 19 is a cross-sectional view along I-II in FIG. 18.
Figure 20:
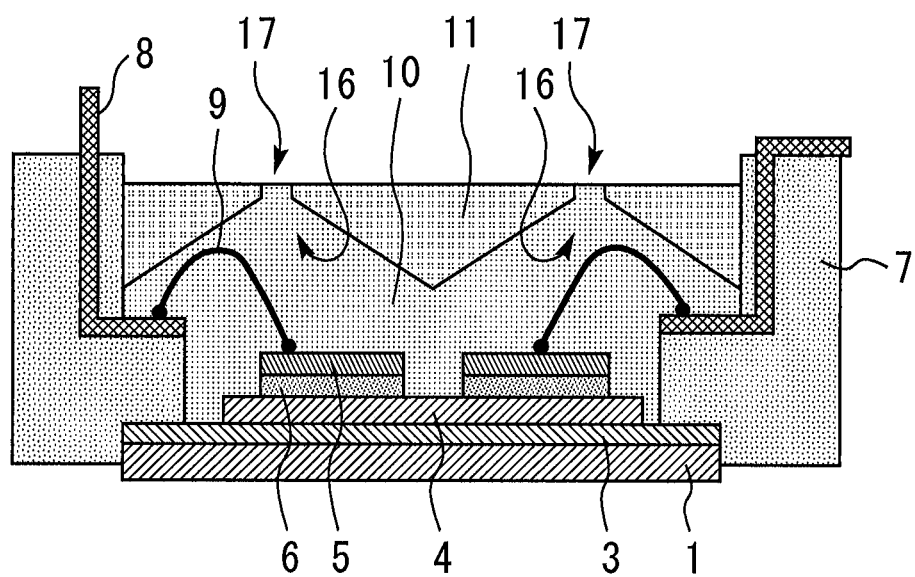
FIG. 20 is a cross-sectional view of the semiconductor module according to the fifth embodiment.

FIG. 18 is a top view illustrating a lid of a semiconductor module according to a fifth embodiment. FIG. 19 is a cross-sectional view along I-II in FIG. 18. FIG. 20 is a cross-sectional view of the semiconductor module according to the fifth embodiment. Two conical concave portions 16 and two holes 17 are provided at the lid 11.

In a case where height of the conical concave portion 16 cannot be increased due to the specification of a size of the semiconductor module, a plurality of concave portions 16 and holes 17 are provided at the lid 11. By this means, because gradient of the tapered portion of the concave portion 16 becomes greater, capability of discharging air bubbles is increased. Further, in a case where the wire 9 is located around a peripheral portion of the lid 11 inside the case 7, because it is possible to form the conical concave portion 16 while avoiding the wire 9, flexibility in the design is increased.

Sixth Embodiment

Figure 21:
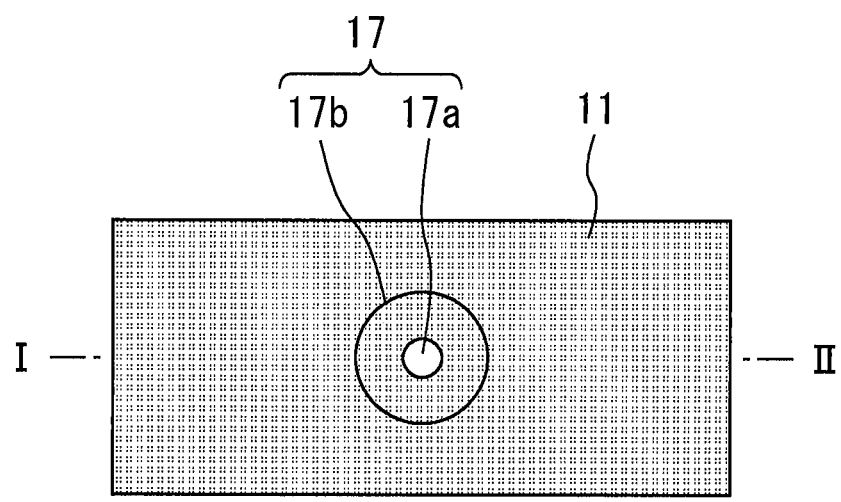
FIG. 21 is a top view illustrating a lid of a semiconductor module according to a sixth embodiment.
Figure 22:
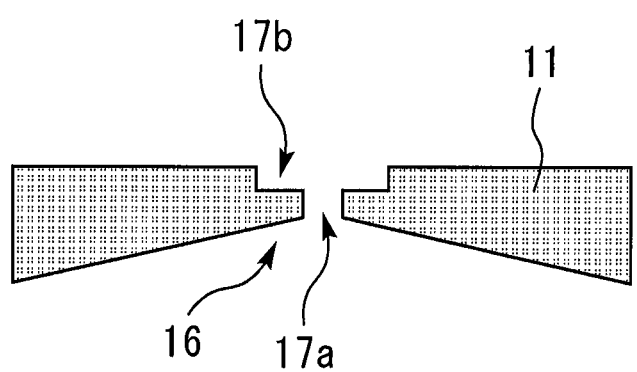
FIG. 22 is a cross-sectional view along I-II in FIG. 21.
Figure 23:
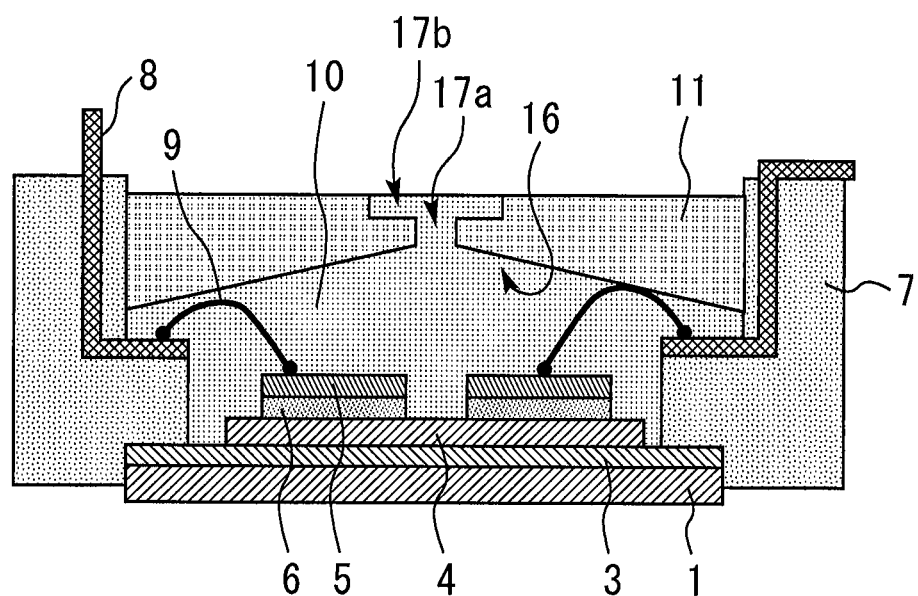
FIG. 23 is a cross-sectional view illustrating the semiconductor module according to the sixth embodiment.

FIG. 21 is a top view illustrating a lid of a semiconductor module according to a sixth embodiment. FIG. 22 is a cross-sectional view along I-II in FIG. 21. FIG. 23 is a cross-sectional view illustrating the semiconductor module according to the sixth embodiment. The hole 17 include's a first hole 17a on the lower surface side of the lid 11, and a second hole 17b which is positioned on the upper surface side of the lid 11 with respect to the first hole 17a and whose opening area is larger than that of the first hole 17a. Therefore, the opening area of the hole 17 is larger on the upper surface side of the lid 11 than on the lower surface side of the lid 11. Note that a configuration of the hole 17 is not limited to a configuration where the hole 17 includes two holes with difference opening areas, and may be a configuration where the hole is formed in a tapered shape.

Figure 24:
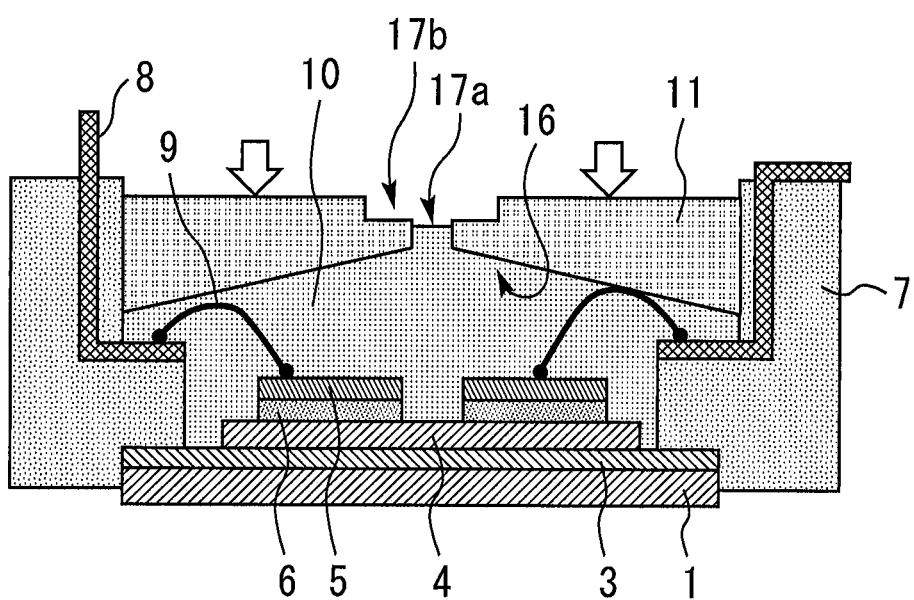
FIG. 24 is a cross-sectional view illustrating aspect where the lid of the semiconductor module according to the sixth embodiment is put on the upper surface of the seal material.

FIG. 24 is a cross-sectional view illustrating aspect where the lid of the semiconductor module according to the sixth embodiment is put on the upper surface of the seal material. When the lid 11 is pushed on the seal material 10 side, the seal material 10 crawls up to the second hole 17b which is located on the upper surface side of the lid 11 and whose opening area is larger. By observing this aspect, it is possible to easily confirm that inside of the case 7 is tightly filled with the seal material 10. Therefore, process for confirming performance of the cured seal material 10 with an X-ray, or the like, becomes unnecessary. Further, there is no gap between the seal material 10 and the lid 11, it is possible to prevent moisture entry through the gap.

Note that, in the first to the sixth embodiments, it is also possible to use a lid 11 which is transparent to visible light. By this means, visibility as to whether or not air bubbles exist is improved, so that it becomes easy to detect an abnormality when an abnormality of entry of air bubbles occurs. Further, it is also possible to use on epoxy resin which has high moisture absorption resistance as the seal material 10, rather than silicone gel. By this means, an amount of moisture entry to inside of the semiconductor module is further reduced, so that it is possible to improve moisture resistance.

The semiconductor chip 5 is not limited to a chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor module in which the semiconductor chip is incorporated. Further, since the semiconductor chip has a high heat resistance, a radiation fin of a heatsink can be miniaturized and a water-cooled part can be air-cooled, which leads to further miniaturization of the semiconductor module. Further, since the semiconductor chip has a low power loss and a high efficiency, a highly efficient semiconductor module can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-000963, filed on Jan. 7, 2020 including specification, claims, drawings and summary, on which the convention priority of the present application is based, is incorporated herein by reference in its entirety.

The invention claimed is:

1. A semiconductor module comprising:
a case;
a semiconductor chip provided inside the case;
a seal material injected to inside of the case and sealing the semiconductor chip; and
a lid provided inside the case and contacting an upper surface of the seal material, wherein
a tapered portion is provided to extend from an outermost end of the lid on an upper surface side,
a gap is provided between a side surface of the outermost end portion of the lid and an inner side surface of the case, the seal material crawls up to the tapered portion through the gap, and a width of the gap from the outermost end portion to the inner side surface is equal to or less than 2 mm.

2. The semiconductor module according to claim 1, wherein a conical protruding portion whose central portion protrudes and directly contacts the seal material is provided at a lower surface of the lid.

3. The semiconductor module according to claim 1, wherein a flow channel through which the seal material flows toward the end portion of the lid is provided on a lower surface of the lid.

4. The semiconductor module according to claim 2, wherein a flow channel through which the seal material flows toward the end portion of the lid is provided on a lower surface of the lid.

5. The semiconductor module according to claim 1, wherein the lid is transparent.

6. The semiconductor module according to claim 2, wherein the lid is transparent.

7. The semiconductor module according to claim 1, wherein the seal material is an epoxy resin.

8. The semiconductor module according to claim 2, wherein the seal material is an epoxy resin.

9. The semiconductor module according to claim 1, wherein the semiconductor chip is formed of a wide-band-gap semiconductor.

10. The semiconductor module according to claim 2, wherein the semiconductor chip is formed of a wide-band-gap semiconductor.

\* \* \* \* \*